United States Patent
Wu et al.

(10) Patent No.: US 7,180,933 B2
(45) Date of Patent: Feb. 20, 2007

(54) SQUELCH CIRCUITRY FOR HIGH SPEED HIGH FREQUENCY OPERATION

(75) Inventors: Ching-Lin Wu, Nantou (TW); Hsien-Feng Liu, Kaohsiung (TW); Hung-Chih Liu, Hsinchu (TW)

(73) Assignee: Silicon Integrated Systems Corporation, Hsinchu (TW)

( * ) Notice: Subject to any disclaimer, the term of this patent is extended or adjusted under 35 U.S.C. 154(b) by 826 days.

(21) Appl. No.: 10/327,271

(22) Filed: Dec. 20, 2002

(65) Prior Publication Data
US 2004/0120389 A1 Jun. 24, 2004

(51) Int. Cl.
*H04L 25/00* (2006.01)

(52) U.S. Cl. .................. 375/217; 455/701; 455/218; 455/219; 455/220; 455/221; 455/222; 455/223; 455/224; 455/225

(58) Field of Classification Search ............. 375/217; 455/701, 212, 218–225, 232.1, 234.1; 330/51, 330/107
See application file for complete search history.

(56) References Cited

U.S. PATENT DOCUMENTS

| | | | | |
|---|---|---|---|---|
| 3,633,112 | A | * | 1/1972 | Anderson .................. 381/107 |
| 5,303,405 | A | * | 4/1994 | Simmons et al. ........... 455/213 |
| 5,436,934 | A | * | 7/1995 | Co .............................. 375/351 |
| 5,448,200 | A | * | 9/1995 | Fernandez et al. .......... 327/560 |
| 5,694,088 | A | * | 12/1997 | Dickson ...................... 331/12 |
| 6,907,096 | B1 | * | 6/2005 | Lueker et al. .............. 375/355 |

* cited by examiner

*Primary Examiner*—Mohammed Ghayour
*Assistant Examiner*—Leila Malek

(57) ABSTRACT

A squelch circuit for operating at high speed and at high frequencies includes a squelch input unit, a low swing pre-amplifier and a sampling and decision circuit. The squelch input unit pre-processes the positive and negative signals of an input signal to generate four pre-processed signals that are paired and sent to the low swing pre-amplifier. The outputs of the low-swing pre-amplifier are then over-sampled by the sampling and decision circuit. Multi-phase clocks are used to control the over-sampling in the sampling and decision circuit. A logic circuit then determines if the state of the input signal based on multiple samples.

8 Claims, 9 Drawing Sheets

SQUELCH CIRCUITRY FOR HIGH SPEED HIGH FREQUENCY OPERATION

FIELD OF THE INVENTION

This invention relates to the field of high frequency devices, and more particularly to a method for squelching noise signal in electronic devices that are required to operate at high speed and high frequency.

BACKGROUND OF THE INVENTION

A squelch circuit is used in high frequency devices to filter out noise signals, and prevent the hiss sound when no signals are present. With the squelch circuit, the input signal must exceed a certain level to be regarded as a meaningful signal for acceptance. Conventional squelch circuits usually compare the input signal, amplify to full swing, and directly determine if the input signal is meaningful by checking the output. FIG. 1 shows the conventional squelch process. The squelch input operation identifies the positive and negative voltages of input signals, and the full swing squelch operation compares the signals and amplifies them to full swing.

To amplify the signals to full swing, the squelch circuit needs to generate a large electrical current, especially when operating at high frequency. This, in turn, needs a large circuit area. FIG. 2 shows a conventional squelch circuit, wherein D and DB represents the positive and negative voltages of the input signal, respectively. The gain of this circuit depends on the input current and the dimension of the transistors. For full swing, the circuit requires a large area. At a lower operating frequency, there are approaches to obtaining high gain without sacrificing limited circuitry area. However, these approaches are not suitable for high frequency operation as the gain decays at high frequencies.

To amplify the signals to full swing, the squelch circuit needs to generate a large electrical current, especially when operating at high frequency. This, in turn, needs a large circuit area. FIG. 2 shows a conventional squelch circuit, wherein D and DB represent the positive and negative voltages of the input signal, respectively. The gain of this circuit depends on the input current and the dimension of the transistors. For full swing, the circuit requires a large area. At a lower operating frequency, there are approaches to obtaining high gain without sacrificing limited circuitry area. However, these approaches are not suitable for high frequency operation as the gain decays at high frequencies. As a result, there is a need in having a squelch circuit that uses a pre-amplifier without a high gain to amplify the input signal, i.e., a low swing pre-amplifier that does not provide full swing amplification.

SUMMARY OF THE INVENTION

The present invention has been made to overcome the above-mentioned drawback of a conventional squelch circuit. The primary object is to provide a squelch circuit that can operate at high frequency without using a large gain and a large circuit area. Accordingly, the squelch circuit of the invention comprises a squelch input unit, a low swing pre-amplifier and a sampling and decision circuit.

The positive and negative input signals are the inputs to the circuit of the squelch input unit in the present invention. Four signals are generated from the squelch input unit and then paired to serve as the inputs to a pair of pre-amplifiers in the low swing pre-amplifier. Each pre-amplifier comprises a pair of amplifier circuits. Each amplifier circuit includes a transistor connected in series with a circuit unit formed by a capacitor, a resistor and a transistor that have an equivalent circuit of an inductor loading.

The output signals of the low swing pre-amplifier are over-sampled by D flip-flops to generate samples of squelch signals. The over-sampling is controlled by a plurality of multi-phase clocks each with a different phase. A decision logic is then used to determine the states of the squelch signals based on the samples of the over-sampled outputs.

The present invention will become more obvious from the following description when taken in connection with the accompanying drawings which show, for purposes of illustration only, a preferred embodiment in accordance with the present invention.

DETAILED DESCRIPTION OF THE INVENTION

Figure 1:
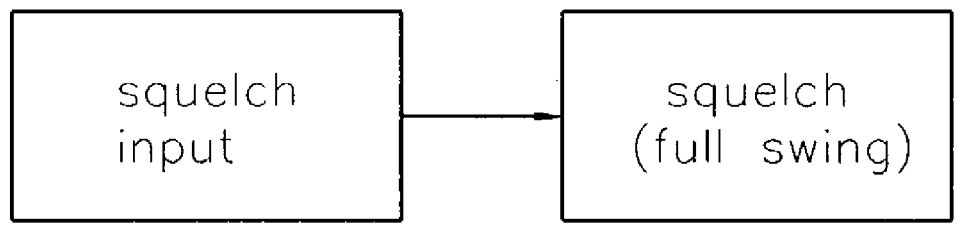
FIG. 1 shows the squelch process of a conventional squelch circuit.
Figure 2:
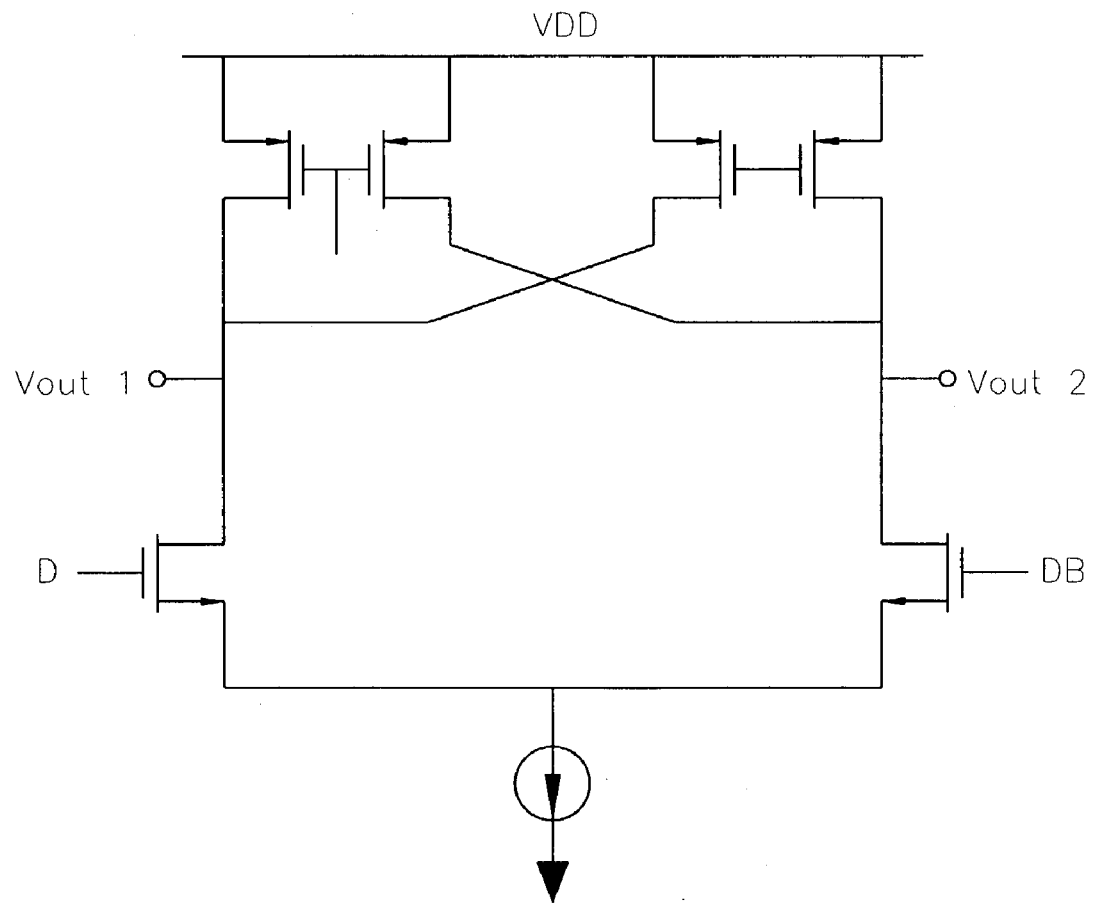
FIG. 2 shows a conventional squelch circuit.
Figure 3:
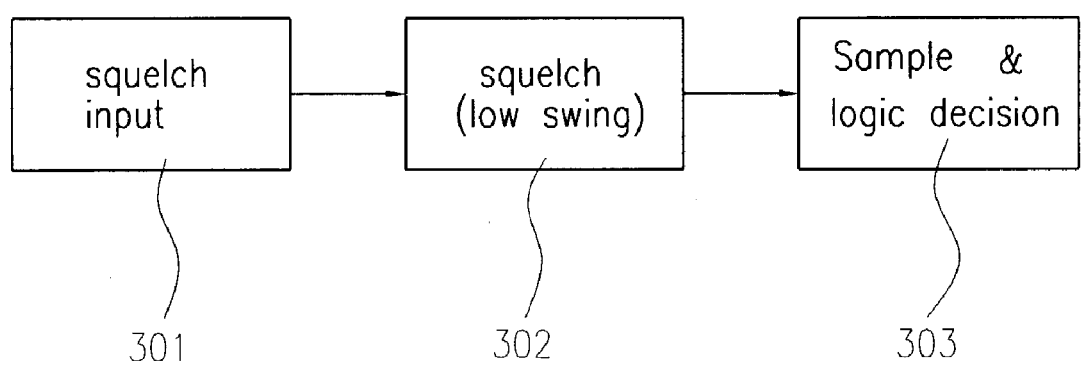
FIG. 3 shows the squelch circuit of the present invention.

FIG. 3 shows the block diagram of the squelch circuit of the present invention. The squelch circuit comprises a squelch input unit 301, a low swing pre-amplifier 302 and a sampling and decision logic 303. The squelch input unit 301 pre-processes the input signals to generate reference voltage levels. The low swing pre-amplifier 302 amplifies the pre-processed signals. The sampling and decision logic 303 samples the signal, and uses a logic circuit to determine the states of the signal.

Figure 4:
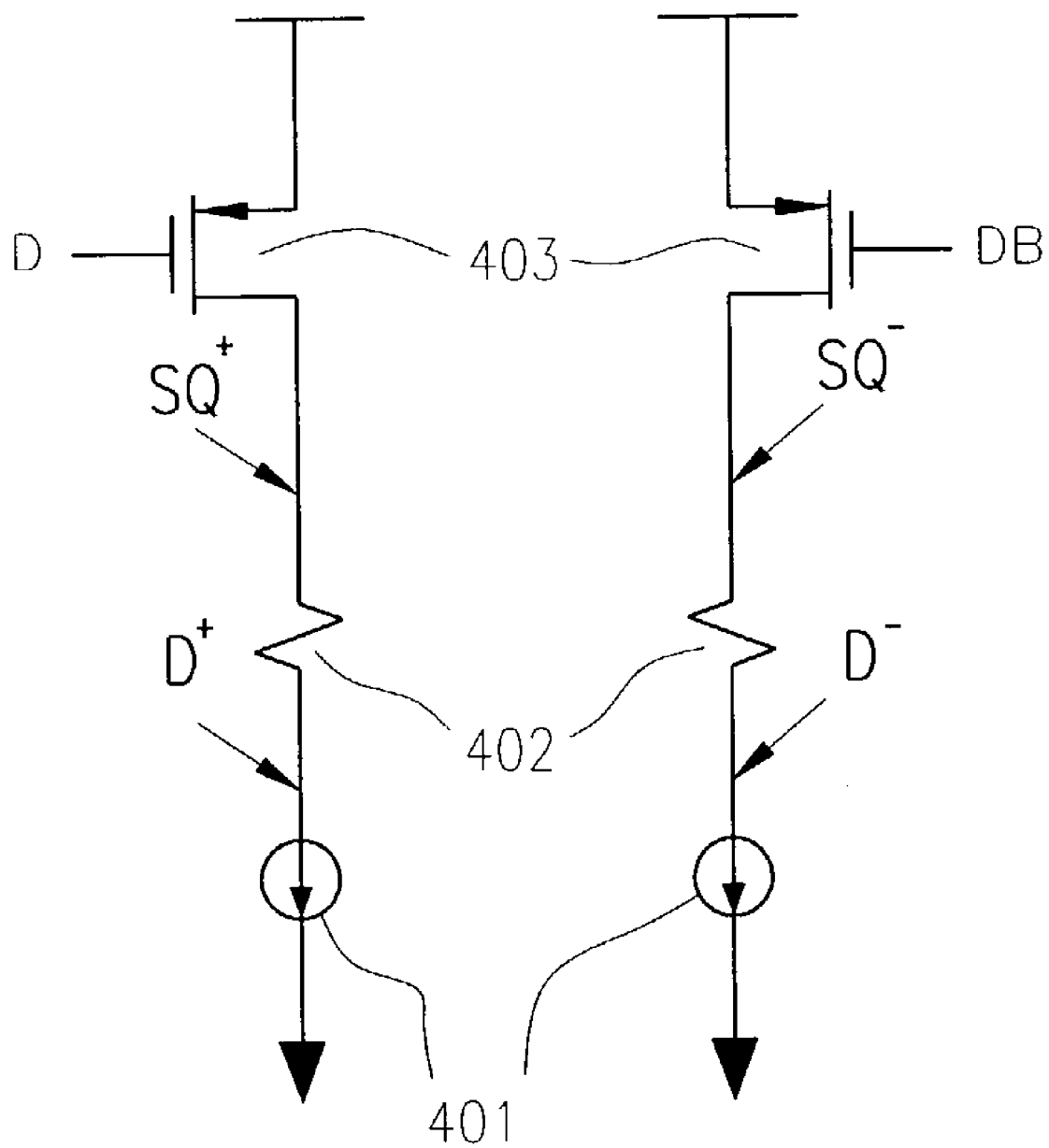
FIG. 4 shows the squelch input unit of the present invention.

FIG. 4 shows the circuit of the squelch input unit 301 of the present invention. The circuit comprises a pair of input circuits each having a current source 401 and a resistor 402 connected in series with a transistor 403. The input signals D and DB are pre-processed to generate four different voltages: D+, D−, SQ+, and SQ−, wherein the voltage difference between the D+ and SQ− is ΔV, and the voltage difference between D− and SQ+ is also ΔV. The voltage drop ΔV is obtained by means of a resistor. The value of the ΔV is adjustable by using different resistors, or adjusting the electrical current. The four voltages are paired as D+ and SQ−, D− and SQ+ and serve as the inputs to the low swing pre-amplifier 302 as shown in FIG. 5.

The voltage drop between the positive end and the negative end of the input signal is compared to the threshold ΔV. When the voltage drop is smaller than ΔV, the input signal is considered as noises, and would be squelched. Otherwise, it is considered as meaningful inputs.

Figure 5:
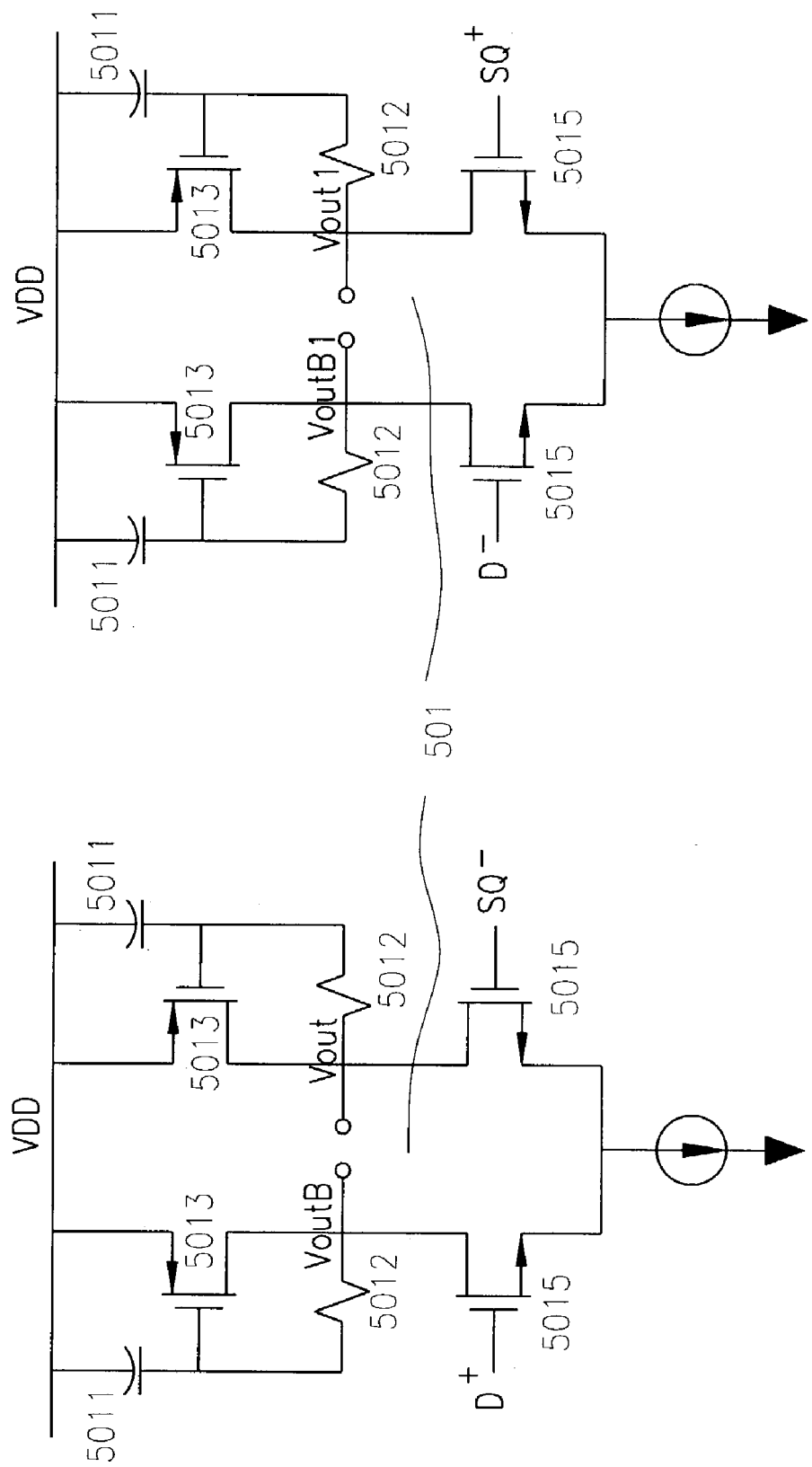
FIG. 5 shows the low swing pre-amplifier of the present invention.
Figure 6:
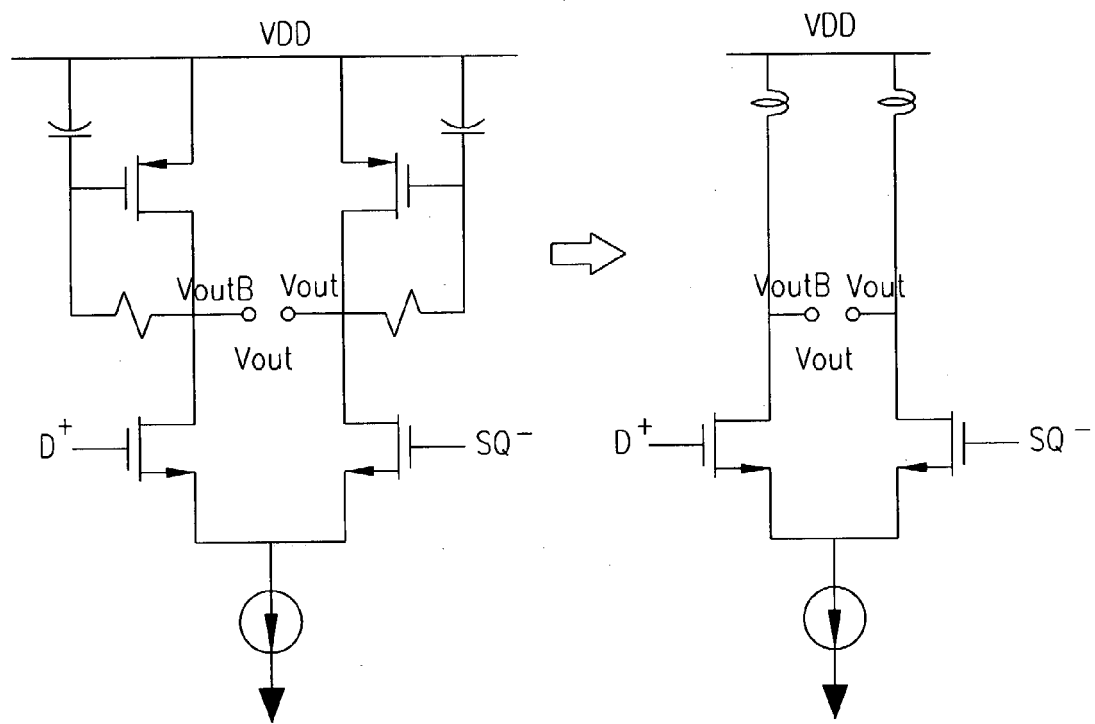
FIG. 6 shows that a circuit formed by a capacitor, a resistor and a transistor in the low swing pre-amplifier is equivalent to inductor loading.

FIG. 5 shows the low swing pre-amplifier 302 of the present invention. As can be seen, D+ and SQ− are sent to one amplifier 501 and D− and SQ+ are sent to the other amplifier. Each amplifier comprises a pair of circuits each being formed by a capacitor 5011, a resistor 5012 and a transistor 5013 for which an equivalent circuit is an inductor loading that allows operations at higher frequency. Because of the resonance of the inductor loading, it is able to obtain high impedance loading, and thus a high gain, at higher frequencies without using large circuit area. The inductor loading is connected in series with a transistor 5015. As shown in FIG. 5, each amplifier has two squelch signals Vout (Vout1) and VoutB (VoutB1). FIG. 6 illustrates the equivalent circuit of the inductor loading.

Figure 7:
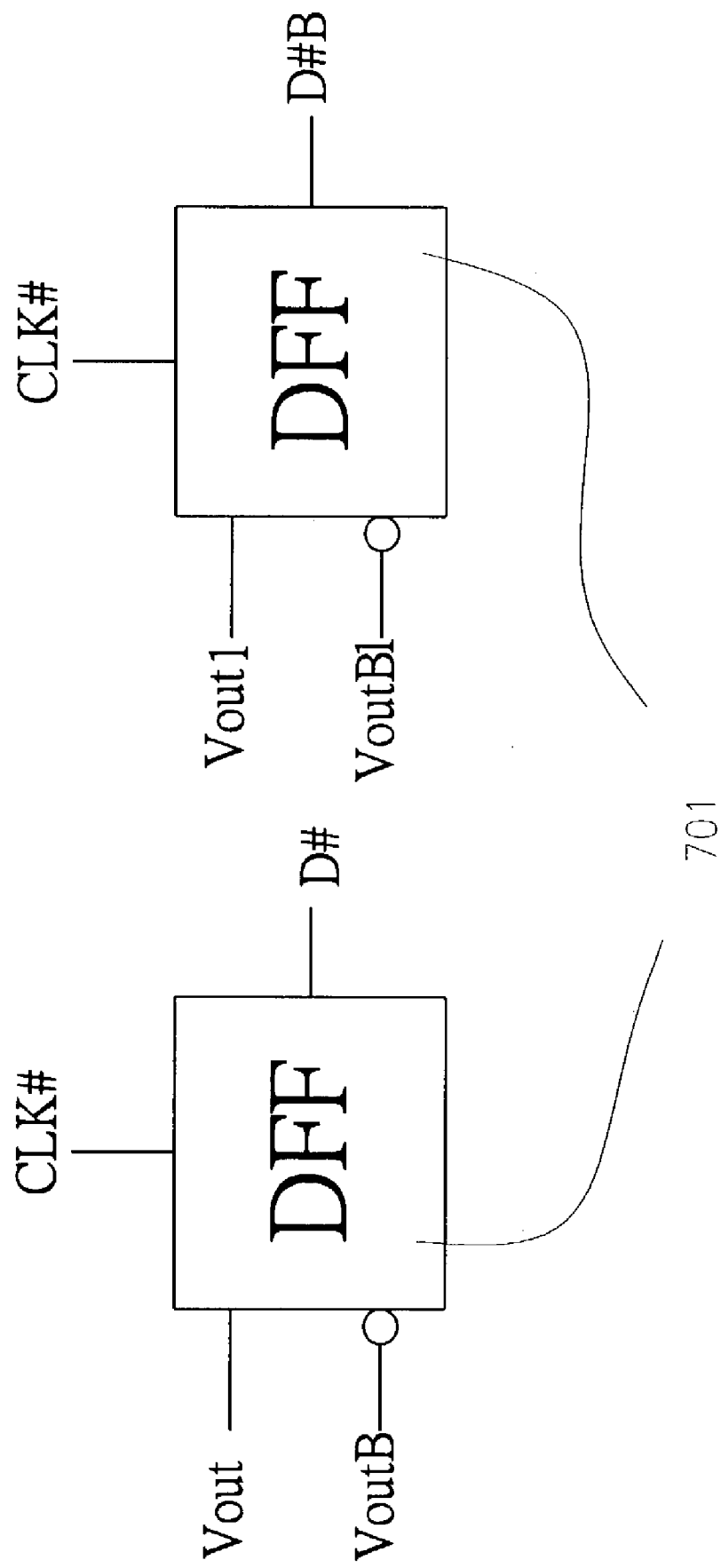
FIG. 7 shows D flip-flops that are used to sample squelch signals according to the present invention.

Unlike prior arts that use full swing amplification, the present invention uses over-sampling to compensate for the lack of high gain. A rear-stage high speed D flip-flop 701 as shown in FIG. 7 is used to over-sample the squelch signals Vout (Vout1) and VoutB (VoutB1). The over-sampled outputs D# and D#B of the D flop-flops controlled by a number of multi-phase clocks are sent to a logic decision circuit as shown in FIG. 8 to determine the states of the signal.

Figure 9:
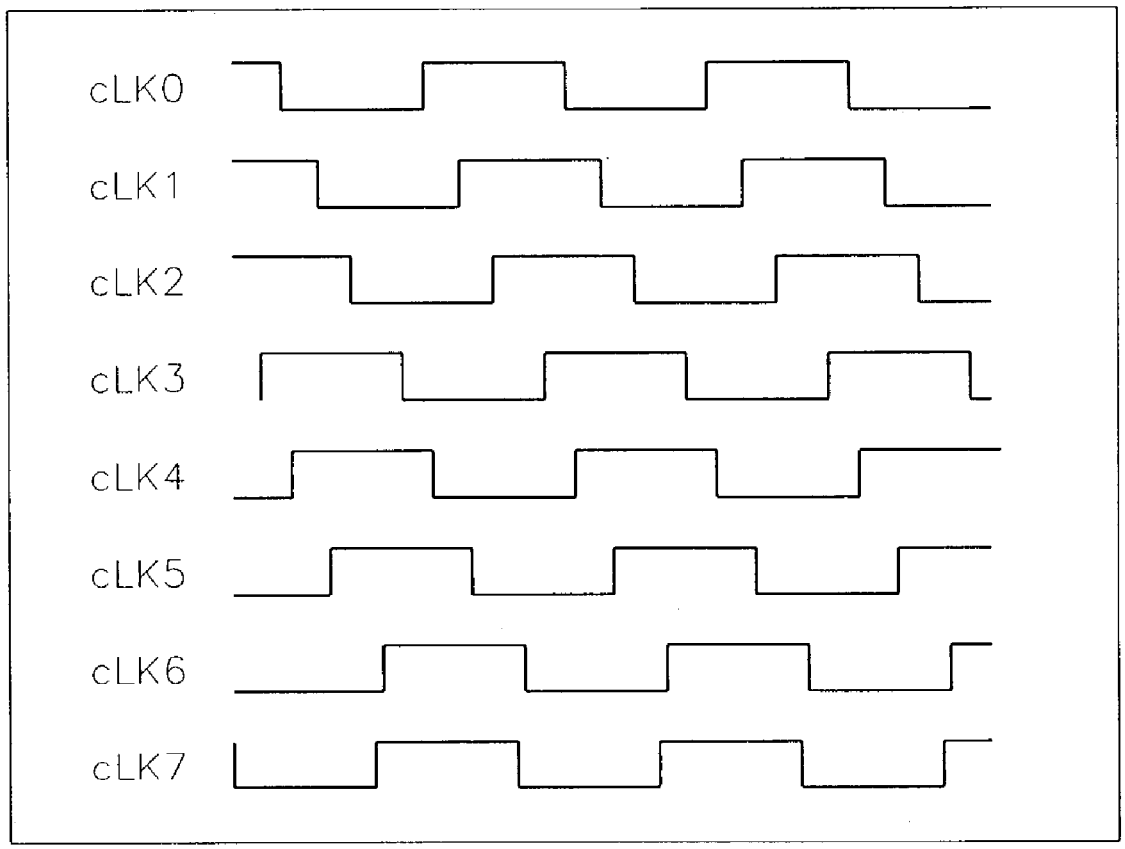
FIG. 9 shows multi-phase clocks that control the D flip-flops for over-sampling.

FIG. 9 shows the waveform of the multi-phase clocks used in controlling the D flip-flop sampling of the present invention. To generate N*M sampling clocks, the present invention uses N input clocks initially, each with a phase difference of 360°/N. Hence, the phases of the input clocks are, $0+\psi$, $(360°*1)/N+\psi$, $(360°*2)/N+\psi$, $(360°*3)/N+\psi$, $(360°*(N-1))/N+\psi$, wherein $\psi$ is a fixed value. These input clocks are delayed to generate (M−1) clocks, each with a different phase. The phase difference between the input clocks, and its derived clocks from delay must be within 0 to 360°/N so that a total of N*M clocks each with a different phase are generated.

Using the high speed D flip-flop and the N*M generated clocks of various phases, the circuit shown in FIG. 7 is able to over-sample the squelch signal at certain times depending on application requirement. FIG. 9 shows the multi-phase clock waveform when N is 4, and M equals 2. One advantage of the over-sampling is that it is not necessary for the delay circuit used to generate N*M clocks to be of high precision. The generated clocks would be workable as long as the phase difference between them is within reasonable approximation.

Figure 8:
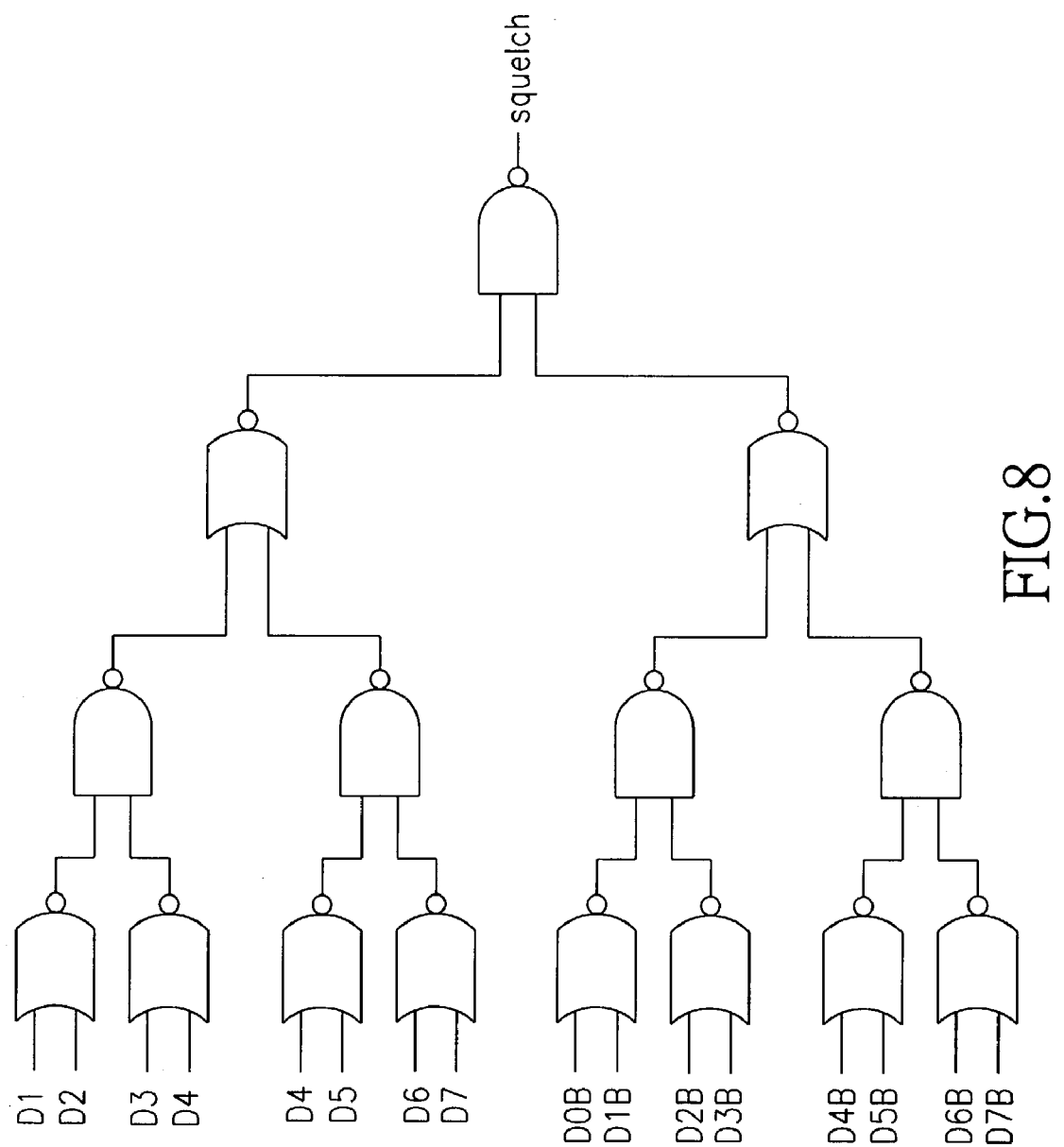
FIG. 8 shows a logic circuit for determining the states of the squelch signal of the present invention.

FIG. 8 illustrates a logic circuit used to determine the states of the signal. For the purpose of identifying the state of the squelch signals, the squelch signal is defined as high when one of the samples is high. FIG. 8 shows a logic circuit when the signals are sampled eight times. According to the present invention, when the noise is smaller than $\Delta V/2$, the squelch circuit can successfully squelch out the noise.

Compared to the prior arts, the present invention provides the following advantages:

1. It allows operating in high speed circuits.
2. The output signals are not amplified to full swing.
3. It requires neither large gain, nor large circuit area and power for the gain.
4. The noise tolerance level is adjustable by varying $\Delta V$.
5. The N*M multiphase clocks are generated with manipulation of the N input clocks, instead of N*M input clocks. This is more practical when M*N is large. In addition, it is not necessary for the delay circuit to be of high precision in generating the phase difference.
6. The reliability and the speed are both higher because the present invention uses over-sampling and a logical decision circuit to determine the states of the input signal.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A squelch circuit for operating at high frequency, comprising:
    a squelch input unit having first and second input circuits for receiving positive and negative signals of an input signal and generating two pairs of pre-processed signals, each of the input circuits including a resistor having a first end connected to a current source and a second end connected to a transistor which receives said positive or negative signal;
    a pre-amplifier for amplifying said two pairs of pre-processed signals and generating two pairs of squelch output signals; and
    a sampling and decision circuit for receiving said two pairs of squelch output signals and determining a state of said input signal;
    wherein a pre-processed signal generated at the first end of the resistor of said first input circuit and a pre-processed signal generated at the second end of the resistor of said second input circuit constitute one pair of said two pairs of pre-processed signals, and a pre-processed signal generated at the second end of the resistor of said first input circuit and a pre-processed signal generated at the first end of the resistor of said second input circuit constitute the other pair of said two pairs of pre-processed signals.

2. The squelch circuit as claimed in claim 1, wherein said pre-amplifier comprises a pair of amplifiers, each amplifier has a pair of amplification circuits and each amplification circuit includes an inductor equivalent circuit formed by a capacitor, a resistor and a transistor.

3. The squelch circuit as claimed in claim 2, wherein said inductor equivalent circuit is connected to a transistor that receives a pre-processed signal.

4. The squelch circuit as claimed in claim 1, wherein said sampling and decision circuit includes a pair of over-sampling circuits, each over-sampling circuit receiving a pair of squelch output signals and generating over-sampled samples.

5. The squelch circuit as claimed in claim 4, wherein said over-sampling circuit is a D flip-flop controlled by multi-phase clocks.

6. The squelch circuit as claimed in claim 5, wherein said multi-phase clocks comprise N groups of sampling clocks generated from N input clocks, each group having M sampling clocks derived by delaying an associated input clock with a phase between 0° and 3600°/N, and said N input clocks having phases equally distributed between 0° to 3600°.

7. The squelch circuit as claimed in claim 6, wherein said sampling and decision circuit comprises a logic circuit for determining the state of said input signal based on multiple samples obtained by said over-sampling circuit.

8. The squelch circuit as claimed in claim 7, wherein said logic circuit outputs a high state if at least one of said multiple samples is a high state.

* * * * *